(12) United States Patent
Kameishi

(10) Patent No.: US 11,009,797 B2
(45) Date of Patent: May 18, 2021

(54) DEFECT INSPECTION APPARATUS, DEFECT INSPECTION METHOD, AND RECORDING MEDIUM

(71) Applicant: TOSHIBA MEMORY CORPORATION, Tokyo (JP)

(72) Inventor: Kouta Kameishi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 138 days.

(21) Appl. No.: 16/293,961

(22) Filed: Mar. 6, 2019

(65) Prior Publication Data

US 2020/0089131 A1  Mar. 19, 2020

(30) Foreign Application Priority Data

Sep. 19, 2018  (JP) .............................. JP2018-174859

(51) Int. Cl.
*G03F 7/20*  (2006.01)
*G06T 7/00*  (2017.01)

(52) U.S. Cl.
CPC ........ *G03F 7/70625* (2013.01); *G03F 7/7065* (2013.01); *G03F 7/70491* (2013.01); *G03F 7/70641* (2013.01); *G06T 7/001* (2013.01)

(58) Field of Classification Search
None
See application file for complete search history.

(56) References Cited

U.S. PATENT DOCUMENTS

| | | | | |
|---|---|---|---|---|
| 6,546,125 B1* | 4/2003 | Su | ........................ | G03F 7/70491 348/87 |
| 8,671,366 B2 | 3/2014 | Tanaka et al. | | |
| 9,390,490 B2 | 7/2016 | Takagi et al. | | |
| 2006/0245636 A1* | 11/2006 | Kitamura | ................ | G06K 9/036 382/149 |
| 2007/0035728 A1* | 2/2007 | Kekare | ..................... | G03F 1/84 356/237.5 |
| 2008/0292176 A1* | 11/2008 | Sakai | ...................... | G06T 7/001 382/144 |
| 2013/0070078 A1* | 3/2013 | Takagi | .................... | G06T 7/001 348/80 |
| 2018/0266968 A1* | 9/2018 | Hirai | ....................... | H01L 22/12 |
| 2019/0005650 A1* | 1/2019 | Oya | ........................ | G06T 5/003 |
| 2020/0089131 A1* | 3/2020 | Kameishi | ................ | G03F 7/705 |

FOREIGN PATENT DOCUMENTS

| | | |
|---|---|---|
| JP | 2011141133 A | 7/2011 |
| JP | 2011192766 A | 9/2011 |
| JP | 5712130 B2 | 5/2015 |

* cited by examiner

*Primary Examiner* — Soo Shin
(74) *Attorney, Agent, or Firm* — Holtz, Holtz & Volek PC

(57) ABSTRACT

According to one embodiment, in a defect inspection apparatus, a controller acquires an image of a second actual pattern in a first shot region which corresponds to a design pattern identical to a design pattern corresponding to a first actual pattern, which is consistent in a first comparison process, and which is consistent in a second comparison process. The controller replaces the image of one actual pattern of the first actual pattern and the second actual pattern in the first shot region with the image of the other actual pattern so as to generate a reference image of the first shot region. The controller compares the reference image and the image of the second shot region so as to perform a defect inspection of the second shot region.

20 Claims, 11 Drawing Sheets

FIG.4
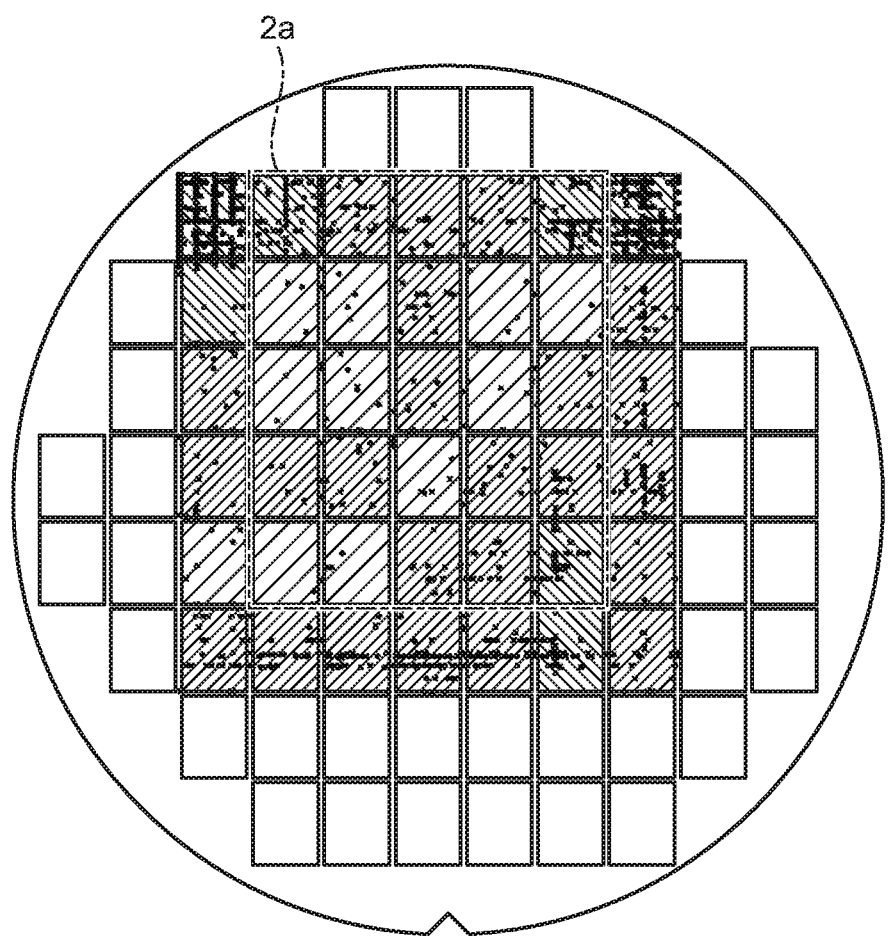
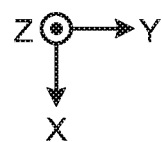

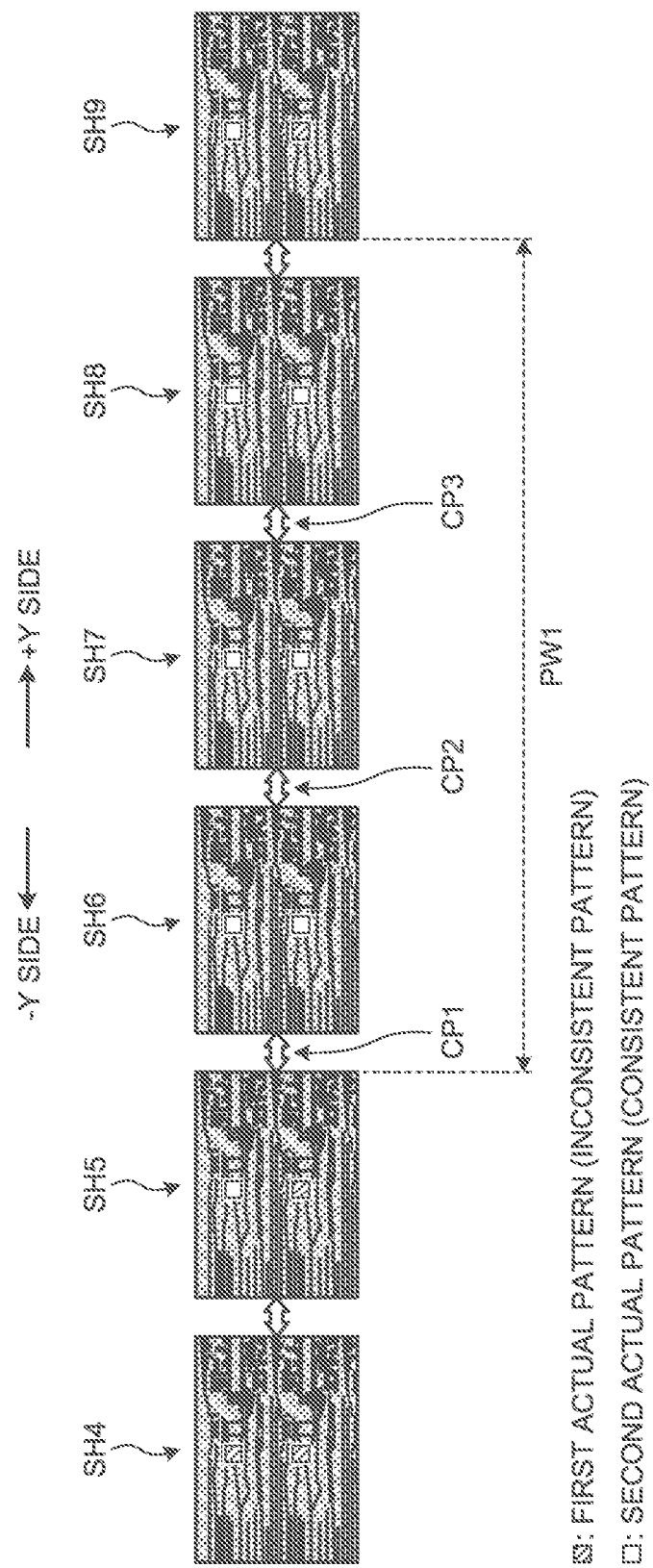

FIG.10A

|  | SH4 | SH5 | SH6 | SH7 | SH8 | SH9 |
|---|---|---|---|---|---|---|
| NUMBER OF PATTERNS (PATTERNS OF INTEREST) | 1000 | 1000 | 1000 | 1000 | 1000 | 1000 |
| NUMBER OF ERRORS | 900 | 700 | 100 | 0 | 100 | 700 |

FIG.10B

|  | SH4 | SH5 | SH6 | SH7 | SH8 | SH9 |
|---|---|---|---|---|---|---|
| NUMBER OF PATTERNS (PATTERNS OF INTEREST) | 1000 | 1000 | 1000 | 1000 | 1000 | 1000 |
| NUMBER OF ERRORS | 900 | 700 | 600 | 0 | 600 | 700 |

DEFECT INSPECTION APPARATUS, DEFECT INSPECTION METHOD, AND RECORDING MEDIUM

CROSS-REFERENCE TO RELATED APPLICATIONS

This application is based upon and claims the benefit of priority from Japanese Patent Application No. 2018-174859, filed on Sep. 19, 2018; the entire contents of which are incorporated herein by reference.

FIELD

Embodiments described herein relate generally to a defect inspection apparatus, a defect inspection method, and a recording medium.

BACKGROUND

A defect inspection apparatus sometimes inspects a defect of a substrate including a plurality of shot regions having different lithography conditions by comparing images of the plurality of shot regions. At this time, it is desirable to improve the defect inspection accuracy.

BRIEF DESCRIPTION OF THE DRAWINGS

FIG. 4 is a view illustrating an inspection result of the FEM substrate according to the embodiment;

FIG. 9 is a view illustrating a process of comparing an image of a shot region to be inspected with an image of an adjacent shot region according to the embodiment;

FIGS. 10A and 10B are views illustrating information to determine a correct pattern according to the embodiment.

DETAILED DESCRIPTION

In general, according to one embodiment, there is provided a defect inspection apparatus including a stage and a controller. On the stage, a substrate including a plurality of shot regions having common design information and mutually different lithography conditions is placed. The controller performs a first comparison process between an image of a first shot region and an image of a second shot region. The first shot region and the second shot region are adjacent to each other among the plurality of shot regions. The controller performs a second comparison process between the image of the second shot region and an image of a third shot region adjacent to the second shot region on a side opposite to the first shot region. The controller acquires an image of a first actual pattern in the first shot region, the first actual pattern corresponding to a location in the first shot region, the second shot region, and the third shot region which is not consistent in the first comparison process but is consistent in the second comparison process, and acquires an image of a second actual pattern in the first shot region which corresponds to a design pattern identical to a design pattern corresponding to the first actual pattern, and which corresponds to a location in the first shot region, the second shot region, and the third shot region which is consistent in the first comparison process, and which is consistent in the second comparison process. The controller replaces the image of one actual pattern of the first actual pattern and the second actual pattern in the first shot region with the image of the other actual pattern so as to generate a reference image of the first shot region. The controller compares the reference image and the image of the second shot region so as to perform a defect inspection of the second shot region.

Exemplary embodiments of a defect inspection apparatus will be explained below in detail with reference to the accompanying drawings. The present invention is not limited to the following embodiments.

Embodiment

The defect inspection apparatus according to the embodiment can be applied to a manufacturing system to manufacture a semiconductor device. The semiconductor device can be obtained by creating a mask based on design information and performing exposure and development using the mask, and it is desired to properly secure a lithography margin in an exposure step in order to properly manufacture the semiconductor device based on the design information. Thus, in the manufacturing system, a focus exposure matrix (FEM) substrate including a plurality of shot regions having common design information and mutually different lithography conditions (for example, a combination of an exposure dose amount and a focus value) is manufactured, and an inspection on whether a proper lithography margin has been secured is performed by the defect inspection apparatus.

Figure 1:
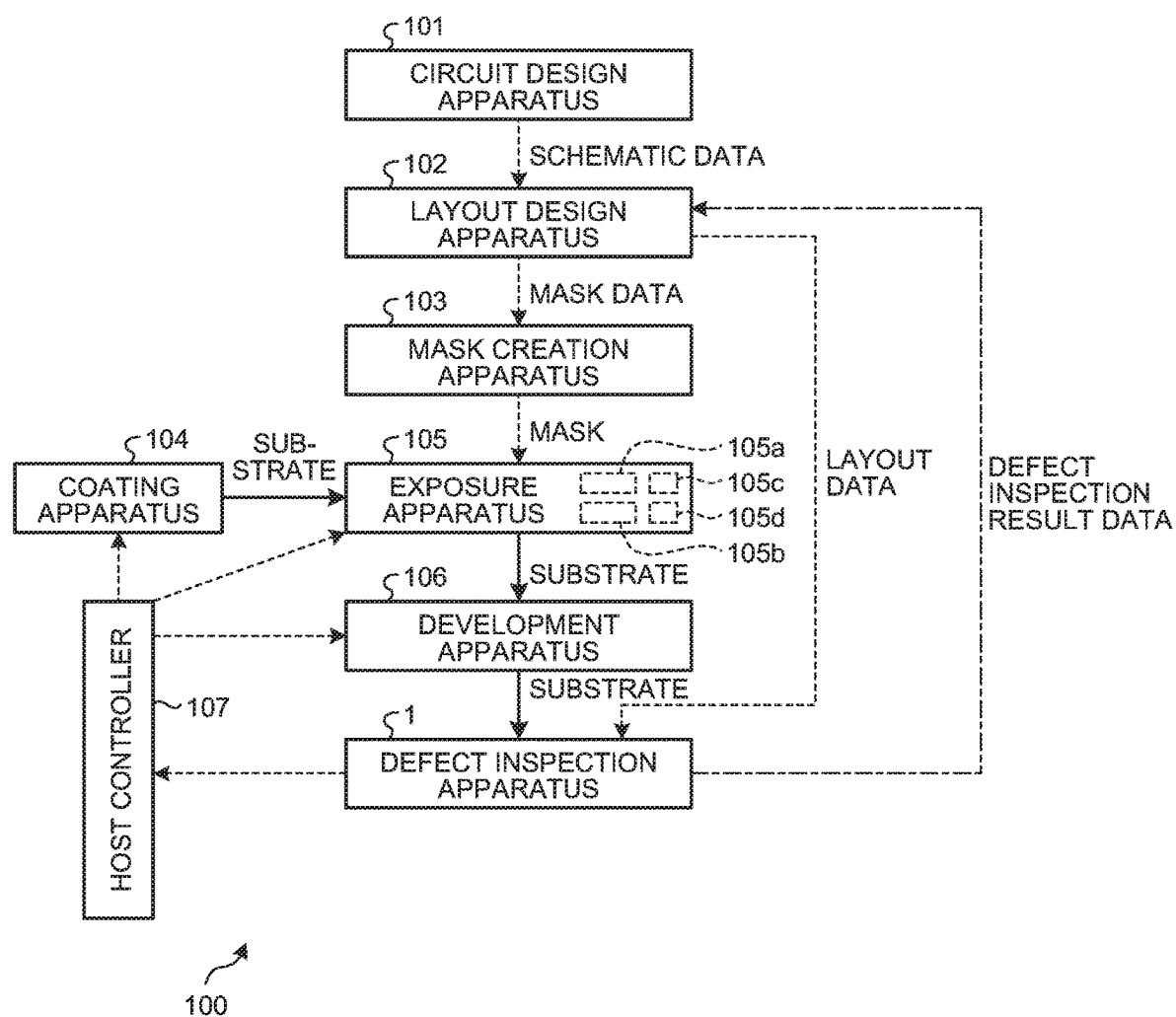
FIG. 1 is a block diagram illustrating a configuration of a manufacturing system including a defect inspection apparatus according to an embodiment.

For example, a manufacturing system 100 including a defect inspection apparatus 1 can be configured as illustrated in FIG. 1. FIG. 1 is a diagram illustrating a configuration of the manufacturing system 100 including the defect inspection apparatus 1.

The manufacturing system 100 includes a circuit design apparatus 101, a layout design apparatus 102, a mask creation apparatus 103, a coating apparatus 104, an exposure apparatus 105, a development apparatus 106, the defect inspection apparatus 1, and a host controller 107. The circuit design apparatus 101 and the layout design apparatus 102 may be implemented by a single computer or may be implemented by a plurality of computers connected to be capable of communicating with each other. For example, an electron beam drawing apparatus can be used as the mask creation apparatus 103. The circuit design apparatus 101, the layout design apparatus 102, the mask creation apparatus 103, and the defect inspection apparatus 1 can communicate with each other via a communication line (not illustrated). The coating apparatus 104, the exposure apparatus 105, the development apparatus 106, the defect inspection apparatus 1, and the host controller 107 can be connected to be capable of communicating with other via a communication line (not illustrated).

Figure 2:
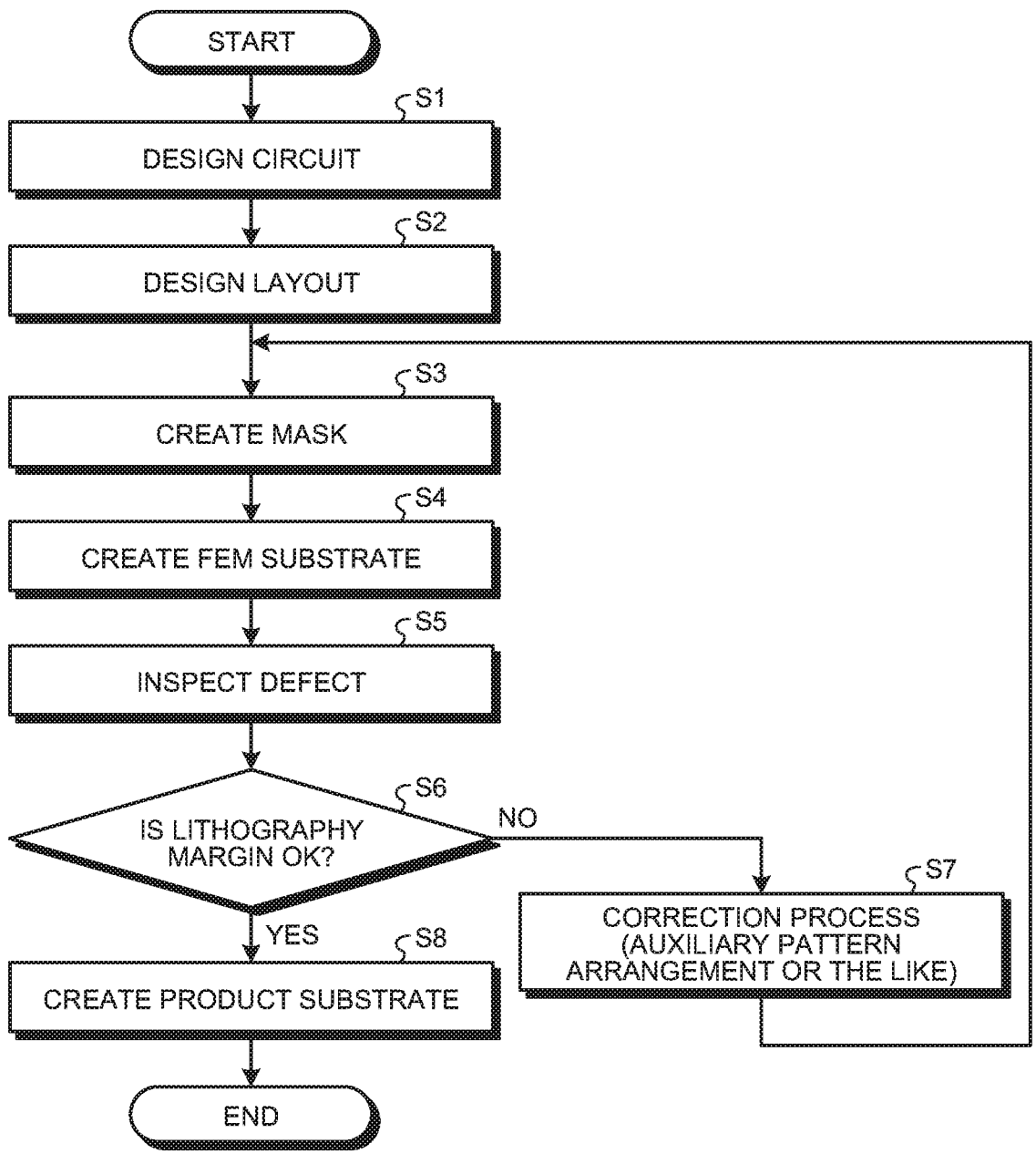
FIG. 2 is a flowchart illustrating an operation of the manufacturing system including the defect inspection apparatus according to the embodiment.

Further, the manufacturing system 100 operates as illustrated in FIG. 2. FIG. 2 is a flowchart illustrating the operation of the manufacturing system 100.

The circuit design apparatus 101 designs a circuit based on predetermined design information and/or an instruction from a user (S1), generates schematic data and supplies the schematic data to the layout design apparatus 102.

The layout design apparatus 102 performs layout design (S2) based on the schematic data and/or an instruction from the user and generates layout data. The layout design apparatus 102 further generates mask data from the layout data based on predetermined design information and/or an instruction from the user and supplies the mask data to the mask creation apparatus 103.

The mask creation apparatus 103 draws a predetermined mask pattern on a mask substrate according to the mask data and creates a mask (S3). The created mask can be set on a mask stage 105a of the exposure apparatus 105.

On the other hand, the host controller 107 controls the coating apparatus 104, a conveyance system (not illustrated), the exposure apparatus 105, and the development apparatus 106 to create an FEM substrate 2 (S4). That is, the coating apparatus 104 coats the top of a substrate (for example, a wafer) with a photosensitive agent (for example, a resist). The substrate coated with the photosensitive agent is conveyed from the coating apparatus 104 to the exposure apparatus 105 by the conveyance system (not illustrated) and placed on a substrate stage 105b. The exposure apparatus 105 causes exposure light, illuminated by an illumination optical system 105c and transmitted through the mask, to be imaged on the substrate by a projection optical system 105d and transfers the mask pattern on the mask to the photosensitive agent on the substrate to form a latent image. At this time, the exposure apparatus 105 controls the illumination optical system 105c and the projection optical system 105d such that the respective shot regions have mutually different combinations of an exposure dose amount with respect to the substrate by the illumination optical system 105c and a focus value defining an imaging plane of the substrate by the projection optical system 105d.

Figure 3:
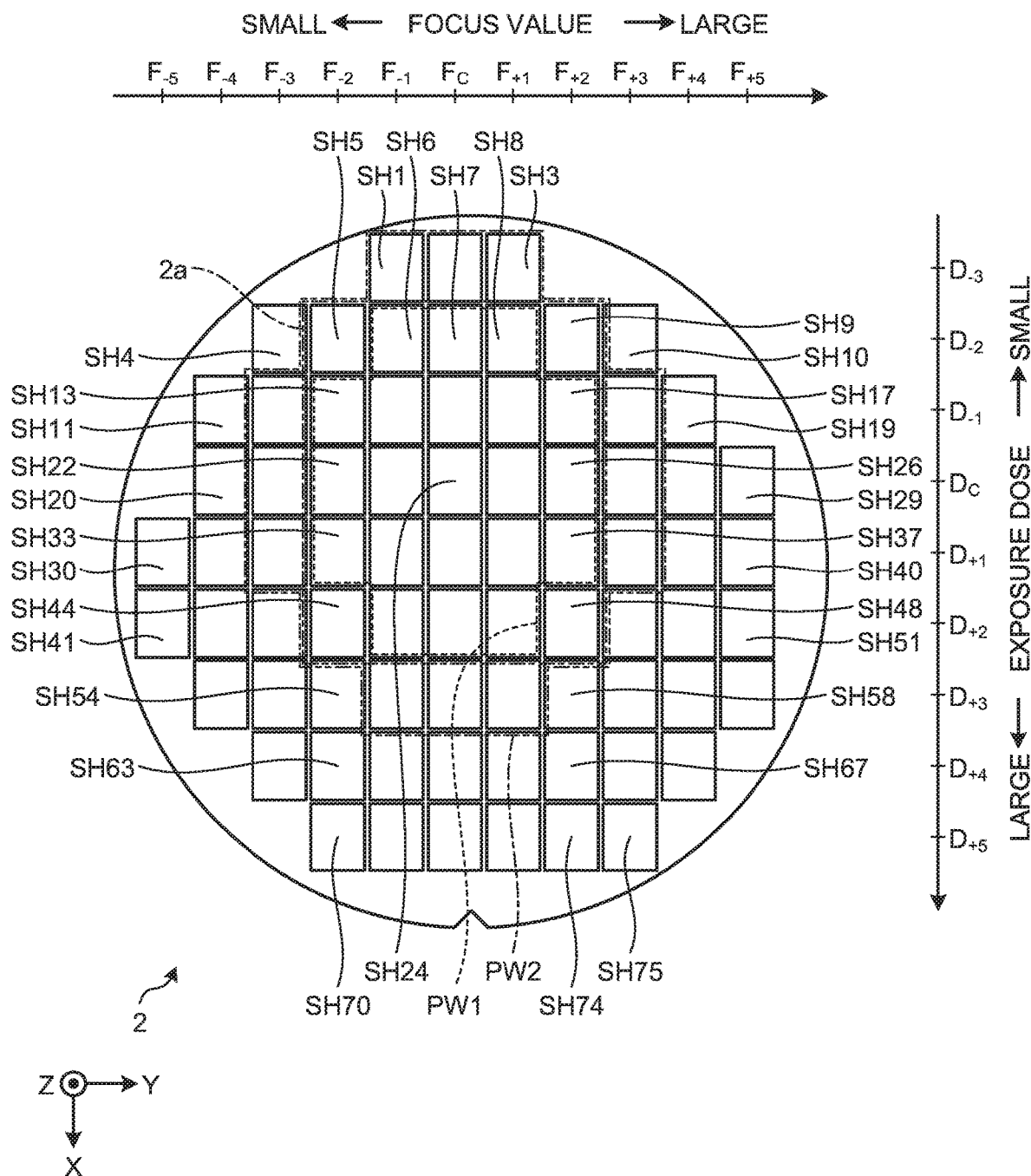
FIG. 3 is a view illustrating a distribution of lithography conditions and a desired lithography margin in a focus exposure matrix (FEM) substrate according to the embodiment.

As a result, a substrate including a plurality of shot regions SH1 to SH75 having common design information and mutually different lithography conditions is created as the FEM substrate 2 as illustrated in FIG. 3. FIG. 3 is a view illustrating a distribution of the lithography conditions in the FEM substrate 2 and a desired lithography margin. In FIG. 3, a direction perpendicular to a surface of the FEM substrate 2 is a Z direction, and two directions orthogonal to each other within a plane perpendicular to the Z direction are an X direction and a Y direction. Although FIG. 3 illustrates a case where 75 shot regions are arranged on the substrate, the number of shot regions is not limited to 75.

In the FEM substrate 2 illustrated in FIG. 3, the plurality of shot regions SH1 to SH75 is arrayed in the X direction and the Y direction. In the FEM substrate 2, shot regions having different exposure dose amounts are arrayed side by side in the X direction, and shot regions having different focus values are arrayed side by side in the Y direction. When a desired lithography condition under which high yield is expected is a combination of an exposure dose amount Dc and a focus value Fc, the shot region SH24 corresponding to the combination of the exposure dose amount Dc and the focus value Fc is set as a desired shot region (Golden Die) and is arranged in the vicinity of the center of the FEM substrate 2. Further, in the FEM substrate 2, shot regions are arrayed side by side such that the exposure dose amount gradually increases from the exposure dose amount Dc to $D_{+1}$, $D_{+2}$, $D_{+3}$, $D_{+4}$, and $D_{+5}$ as proceeding to the +X side and shot regions are arrayed side by side such that the exposure dose amount gradually decreases from the exposure dose amount Dc to $D_{-1}$, $D_{-2}$, and $D_{-3}$ as proceeding to the −X side, with the shot region SH24 as the center. In the FEM substrate 2, shot regions are arrayed side by side such that the focus value gradually increases from the focus value Fc to $F_{+1}$, $F_{+2}$, $F_{+3}$, $F_{+4}$, and $F_{+5}$ as proceeding to the +Y side, and shot regions are arrayed side by side such that the focus value gradually decreases from the focus value Fc to $F_{-1}$, $F_{-2}$, $F_{-3}$, $F_{-4}$, and $F_{-5}$ as proceeding to the −Y side, with the shot region SH24 as the center.

For example, when the proper lithography margin is the exposure dose amount $D_{-2}$ to $D_{+2}$ and the focus value $F_{-2}$ to $F_{+2}$, a region 2a illustrated in FIG. 3 is a region illustrating the proper lithography margin. The region 2a includes a plurality of shot regions SH5 to SH9, SH13 to SH17, SH22 to SH26, SH33 to SH37, and SH44 to SH48.

Returning to FIG. 2, the FEM substrate 2 after exposure is conveyed from the exposure apparatus 105 to the development apparatus 106 by the conveyance system (not illustrated) in S4. The development apparatus 106 develops the latent image of the photosensitive agent on the FEM substrate 2. As a result, a pattern corresponding to the design information (mask data) is developed in the shot regions SH1 to SH75 on the FEM substrate 2.

The FEM substrate 2 after development is conveyed from the development apparatus 106 to the defect inspection apparatus 1 by the conveyance system (not illustrated). The defect inspection apparatus 1 performs a defect inspection on the FEM substrate 2 (S5). For example, the defect inspection apparatus 1 acquires images of shot regions SH1 to SH75 using an optical microscope, and performs image processing such as edge detection on the images of the plurality of shot regions to generate contour images of the shot regions SH1 to SH75. Then, the defect inspection apparatus 1 compares a contour image of a shot region to be inspected with a contour image of a reference shot region by pattern matching to obtain a matching score indicating the degree of consistency, detects a portion where the matching score is lower than a score threshold as a defective point, and obtains a detection result as illustrated in FIG. 4. FIG. 4 is a view illustrating an inspection result of the FEM substrate 2. In FIG. 4, defective points, detected in the respective shot regions when the defect inspection is performed on the shot regions within the region 2a and shot regions adjacent to the region 2a on the +X side, the +Y side, and the −Y side, are indicated by black dots.

Figure 5:
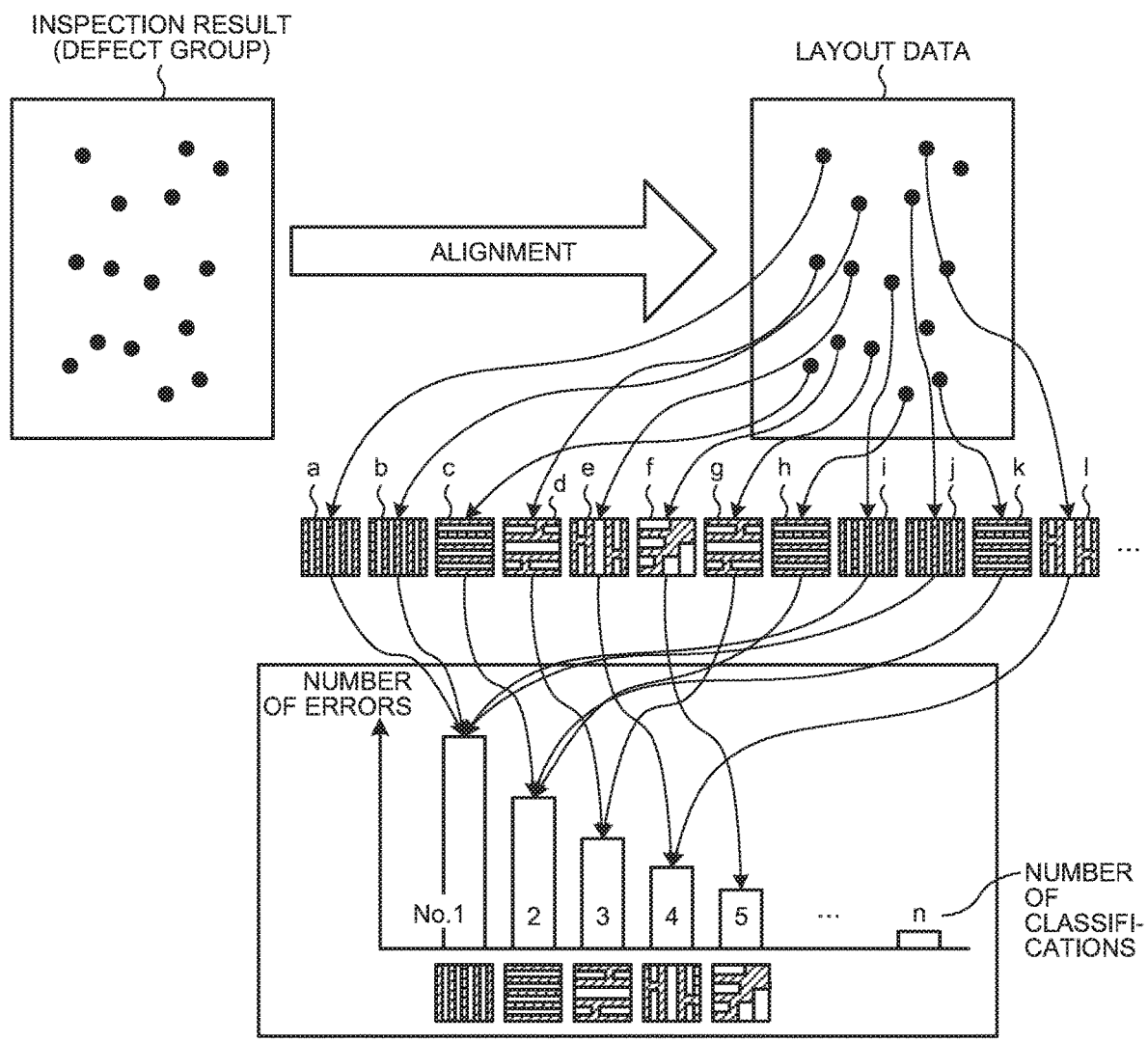
FIG. 5 is a view illustrating a design based binning (DBB) function according to the embodiment.

Further, the defect inspection apparatus 1 classifies a plurality of defective points in the shot region to be inspected for each design pattern (local pattern) using a design based binning (DBB) function as illustrated in FIG. 5. FIG. 4 is a view illustrating the DBB function. According to the DBB function, a local pattern for each defect described in the inspection result is extracted from layout data based on an alignment. Then, the extracted extraction patterns (a to l) are classified into n classification patterns (No. 1 to No. n) based on the degrees of consistency of graphical features. The defect inspection apparatus 1 sets the classification pattern No. 1 having the largest number of errors among the n classification patterns (No. 1 to No. n) as a pattern of interest (that is, a pattern that makes a process window the narrowest among the n classification patterns).

The defect inspection apparatus 1 defines a process window using a shot region in which the number of errors is equal to or smaller than an error threshold among the shot regions SH1 to SH75 of the FEM substrate 2.

Returning to FIG. 2, the defect inspection apparatus 1 determines whether a proper lithography margin has been secured based on the inspection result (S6). For example, if there is a portion where a boundary of the process window of the pattern of interest is set at the inner side of the region 2*a* of the proper lithography margin (for example, when the process window of the pattern of interest is PW1 illustrated in FIG. 3), the defect inspection apparatus 1 can determine that the proper lithography margin has not been secured. If there is a portion where the process window of the pattern of interest includes the region 2*a* of the proper lithography margin at the inner side thereof (for example, when the process window of the pattern of interest is PW2 illustrated in FIG. 3), the defect inspection apparatus 1 can determine that the proper lithography margin has been secured.

When the proper lithography margin has not been secured (No in S6), the defect inspection apparatus 1 notifies the layout design apparatus 102 of defect inspection result data. The layout design apparatus 102 performs correction processing of the mask data by additionally arranging an auxiliary pattern having dimensions equal to or smaller than resolution limits in the vicinity of the design pattern corresponding to the pattern of interest in the layout data or the like, based on predetermined design information and/or an instruction from the user (S7). As a result, the mask creation apparatus 103 creates a mask again according to the corrected mask data (S3), the FEM substrate 2 is created again (S4), and the defect inspection apparatus 1 performs the defect inspection again (S5). That is, the loop of S3 to S7 can be repeated until the proper lithography margin can be secured.

When the proper lithography margin has been secured (Yes in S6), the defect inspection apparatus 1 notifies the host controller 107 of such a fact. The host controller 107 controls the coating apparatus 104, the conveyance system (not illustrated), the exposure apparatus 105, and the development apparatus 106 to create a product substrate 2' with desired lithography conditions (the exposure dose amount Dc and the focus value Fc) (S8).

It is required to perform the determination on whether the proper lithography margin has been secured with high accuracy in S6 in order to properly manufacture the semiconductor device on the product substrate 2'. It is desirable to improve the accuracy of a defect inspection when the shot region to be inspected is located in the vicinity of a boundary of the region 2*a* (see FIG. 3) in S5 in order to make the determination of S6 highly accurate.

For example, a defect detection method using a scanning electron microscope (SEM) tends to take time for an inspection by performing evacuation after loading a substrate to the SEM device and performing vacuum purge before unloading. It is desired to improve the accuracy of a defect inspection in a defect detection method using an optical microscope in order to obtain a quick turnaround time (QTAT) in manufacturing of a semiconductor device.

A first method (Die to Golden) in which an image of a shot region to be inspected (Die) obtained using an optical microscope is compared with an image of a desired shot region (Golden Die) is considered as a defect detection method in S5 In the first method, corresponding lithography conditions (exposure dose amounts and focus values) greatly differ between the image of the shot region (for example, the shot region SH5) in the vicinity of the boundary of the region 2*a* and the image of the desired shot region SH24, and thus, noise components in the images of both the regions can also greatly differ. Thus, in the first method, the accuracy of image comparison is likely to deteriorate as the noise component is erroneously detected as a defect in the image comparison or the like.

Further, a second method (Die to Die) in which an image of a shot region to be inspected (Die) obtained using an optical microscope is compared with each of images of two shot regions (Dies) adjacent on both sides in the X direction (or the Y direction) is considered as the defect detection method in S5. In the second method, it is premised that images of two shot regions adjacent on both sides are correct images. For example, when errors occur frequently in the shot region SH4 adjacent on the −Y side with respect to the shot region SH5 in the vicinity of the boundary of the region 2*a*, an image of the shot region SH4 may be improper as a reference image. Thus, the accuracy of image comparison is likely to deteriorate in the second method as a point which is not defective is erroneously detected as a defect because the reference image is improper when the image of the shot region to be inspected is compared with the images of the two shot regions adjacent on both sides.

Therefore, in the present embodiment, in the defect inspection apparatus 1, one of an image of a pattern which is inconsistent on one side in the comparison of the image of the shot region to be inspected with both the sides and an image of a pattern which corresponds to the same design pattern and is consistent on both the sides is replaced with the other so as to create a reference image, and a defect inspection is performed using the reference image, thereby optimizing the reference image to improve the inspection accuracy of the FEM substrate.

Specifically, in the inspection of the FEM substrate, an error is generated when the shot region to be inspected (own Die) is consistent only with one side of the adjacent shot regions (two Dies) on both sides to be compared. When the number of such errors exceeds the error threshold, it can be determined that a process margin boundary (a cliff of an FEM margin) is between the shot region to be inspected and the shot region on the side that is not consistent (Die on the immediately outer side). A pattern search is performed in the shot region to be inspected on the layout data for coordinates where the error has been generated to extract coordinates of the same design pattern. In the shot region on the side that is not consistent (Die on the immediately outer side), all optical images (local pattern images) of the extracted coordinates are extracted. All the extracted patterns are classified into consistent patterns and inconsistent patterns regarding the comparison between the shot region to be inspected (own Die) and the shot region on the side which is not consistent (Die on the immediately outer side), the number of the consistent patterns and the number of inconsistent pattern are obtained, and one with the larger number is set as a major pattern, and one with the smaller number is set as a minor pattern. Further, the total number of patterns is obtained. If the number of errors is smaller than a half of the total number of patterns, the major pattern is set as a correct pattern, and the minor pattern is set as an incorrect pattern. If the number of errors is larger than the half of the total number of patterns, the minor pattern is set as the correct pattern, and the major pattern is set as the incorrect pattern. In the image of the shot region on the side that is not consistent (Die on the immediately outer side), the image of the incorrect pattern is replaced with the image of the correct pattern to generate a reference image (Golden Image). Then, a defect inspection (Die to Golden Image) using the generated reference image is performed.

Figure 6:
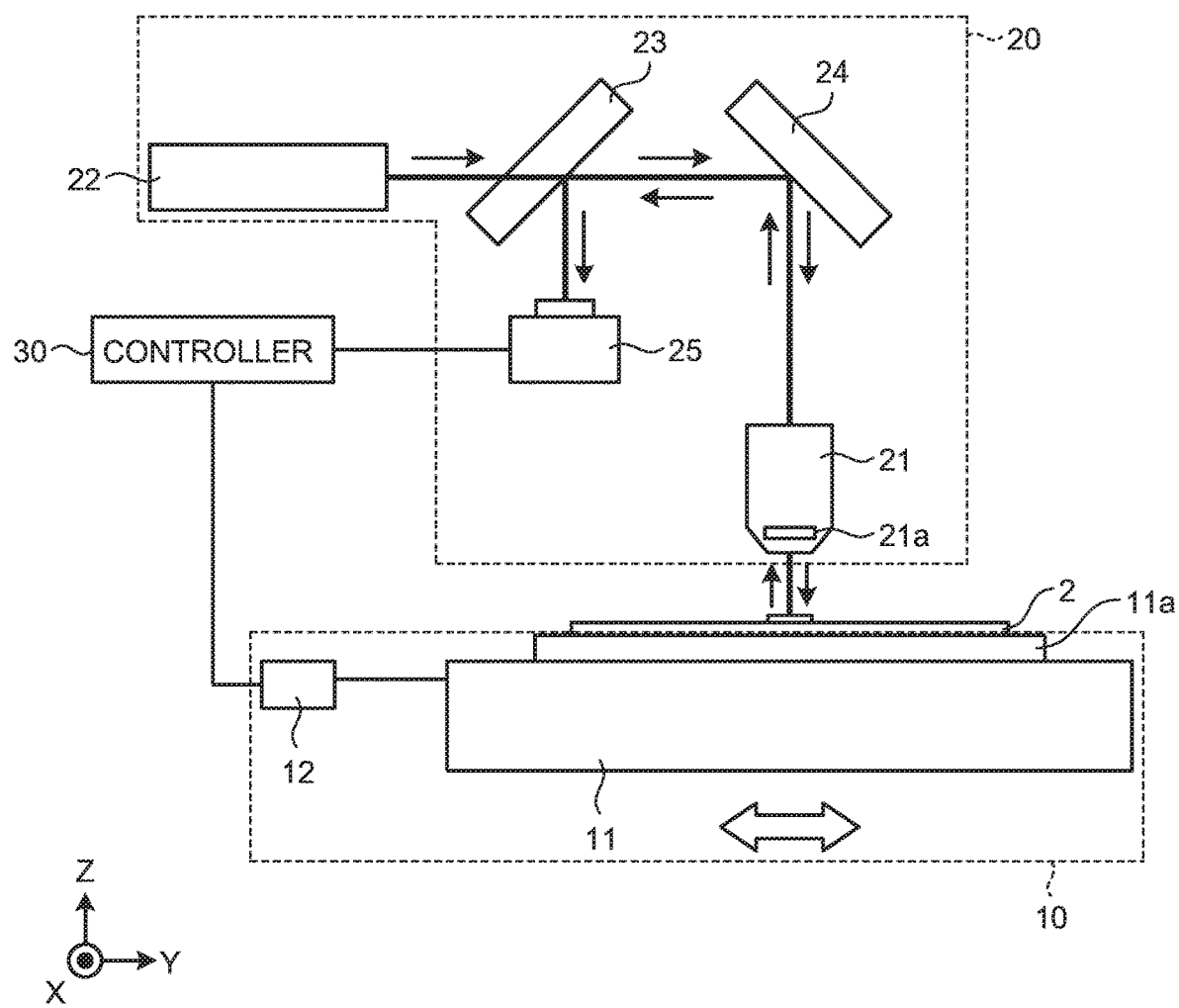
FIG. 6 is a diagram illustrating a configuration of the defect inspection apparatus according to the embodiment.

More specifically, the defect inspection apparatus 1 can be configured as illustrated in FIG. 6. FIG. 6 is a diagram illustrating a configuration of the defect inspection apparatus 1.

The defect inspection apparatus 1 includes a stage 10, an optical system 20, and a controller 30. The stage 10 has a substrate stage 11 and a drive unit 12. The optical system 20 includes an optical microscope 21, a light source 22, an optical prism 23, an optical mirror 24, and an image sensor 25.

On the substrate stage 11, a substrate (for example, the FEM substrate 2 or the product substrate 2') is placed. More specifically, the substrate stage 11 has a ceiling plate (not illustrated), a rough movement stage (not illustrated), a fine movement stage (not illustrated), and a substrate chuck 11a. The ceiling plate is fixed to an alignment measurement device body (not illustrated). The rough movement stage is arranged on the ceiling plate and is driven on the ceiling plate in, for example, six directions (the X direction, the Y direction, the Z direction, a rotation direction about an X axis, a rotation direction about a Y axis, and a rotation direction about a Z axis). The fine movement stage is arranged on the rough movement stage, and is driven on the rough movement stage in, for example, six directions (the X direction, the Y direction, the Z direction, the rotation direction about the X axis, the rotation direction about the Y axis, and the rotation direction about the Z axis) with a shorter stroke and higher accuracy than the rough movement stage. The substrate chuck 11a is arranged on the fine movement stage and attracts the substrate when the substrate is placed. As a result, the substrate stage 11 holds the substrate via the substrate chuck 11a.

The drive unit 12 receives a control signal from the controller 30. The drive unit 12 drives the substrate stage 11 in each of, for example, the six directions (the X direction, the Y direction, the Z direction, the rotation direction about the X axis, the rotation direction about the Y axis, and the rotation direction about the Z axis) in accordance with the control signal. The drive unit 12 includes: a first movable member (not illustrated) provided on one of the ceiling plate and the rough movement stage; a first oscillator (not illustrated) provided on the other side; a second movable member (not illustrated) provided on one of the rough movement stage and the fine movement stage; and a second oscillator (not illustrated) provided on the other side.

The controller 30 causes the drive unit 12 to drive the substrate stage 11 to a predetermined target position. The light source 22 generates light and emits the generated light toward the optical prism 23. The light source 22 is, for example, a xenon lamp or a halogen lamp.

The optical prism 23 is arranged among the light source 22, the optical mirror 24, and the image sensor 25 on an optical path. The optical prism 23 functions as a half mirror, transmits the light emitted from the light source 22 and guides the light to the optical mirror 24, and reflects the light guided from the optical mirror 24 to be guided to the image sensor 25. The image sensor 25 may be a CMOS image sensor, or may be a CCD image sensor.

The optical mirror 24 is arranged between the optical prism 23 and the optical microscope 21 on the optical path. The optical mirror 24 reflects the light guided from the optical prism 23 to be guided to the optical microscope 21, and reflects the light guided from the optical microscope 21 to be guided to the optical prism 23.

The optical microscope 21 is arranged between the optical mirror 24 and the substrate stage 11 on the optical path. The optical microscope 21 has an objective lens 21a, and receives the light guided from the optical mirror 24 by the objective lens 21a to be collected into a pattern group of the shot region to be inspected on the substrate. Further, the optical microscope 21 receives light diffracted by the pattern group of the shot region to be inspected on the substrate by the objective lens 21a, and forms an optical image of the pattern group of the shot region to be inspected on an imaging plane of the image sensor 25 via the optical mirror 24 and the optical prism 23.

The image sensor 25 acquires the optical image formed on the imaging plane to generate an image signal (analog signal). The image sensor 25 supplies the generated image signal to the controller 30.

Figure 7:
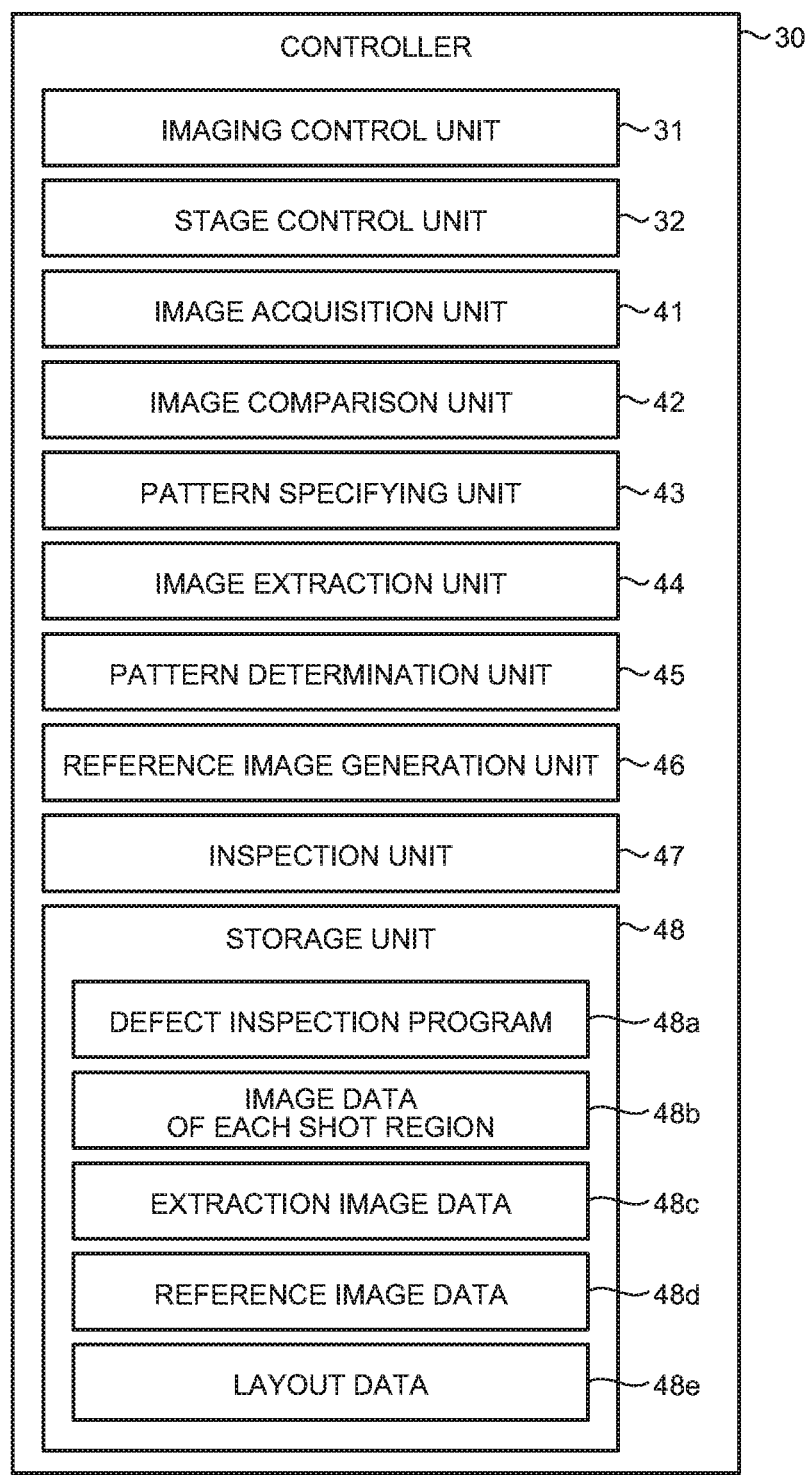
FIG. 7 is a diagram illustrating a configuration of a controller according to the embodiment.

The controller 30 comprehensively controls each unit of the defect inspection apparatus 1. For example, the controller 30 may be configured as illustrated in FIG. 7. FIG. 7 is a diagram illustrating a configuration of the controller 30. The controller 30 includes an imaging control unit 31, a stage control unit 32, an image acquisition unit 41, an image comparison unit 42, a pattern specifying unit 43, an image extraction unit 44, a pattern determination unit 45, a reference image generation unit 46, an inspection unit 47, and a storage unit 48. The storage unit 48 stores a defect inspection program 48a and layout data 48e.

Incidentally, each configuration of the imaging control unit 31, the stage control unit 32, the image acquisition unit 41, the image comparison unit 42, the pattern specifying unit 43, the image extraction unit 44, the pattern determination unit 45, the reference image generation unit 46, and the inspection unit 47 is a functional configuration of the controller 30. These functional configurations may be mounted as hardware (for example, as a system-on-a-chip) in the controller 30, or mounted as software (for example, as function modules which are developed in the storage unit 48 in the controller 30 all at once or sequentially according to the progress of processing by the defect inspection program 48a) in the controller 30. Alternatively, some of the elements may be mounted as hardware in the controller 30, and the remaining elements may be mounted as software in the controller 30.

The stage control unit 32 sequentially drives a plurality of shot regions to be inspected among the plurality of shot regions in the FEM substrate 2 to the −Z side of the optical microscope 21 so as to control the alignment of the stage 10.

The imaging control unit 31 controls driving of each configuration of the optical system 20 so as to acquire an image of a shot region to be inspected while the stage 10 is controlled to be aligned on the shot region to be inspected.

The image acquisition unit 41 receives an image signal from the image sensor 25. The image acquisition unit 41 performs predetermined analog signal processing on the received image signal and performs A/D conversion of the processed image signal (analog signal) to generate an image signal (digital signal). Then, the image acquisition unit 41 performs predetermined digital signal processing on the image signal (digital signal) to generate image data, acquires a contour image (hereinafter simply referred to as an image) of the shot region to be inspected from the image data by image processing such as edge detection, and supplies the acquired image to the image comparison unit 42, and stores the image as the image data 48b of each shot region in the storage unit 48.

When receiving the respective images of the plurality of shot regions to be inspected in the FEM substrate 2, the image comparison unit 42 performs a first comparison process and a second comparison process. The first comparison process is a comparison performed by pattern matching between an image of a first shot region and an image of a second shot region among the plurality of shot regions to be inspected. The first shot region and the second shot region are adjacent to each other. The second comparison process is a comparison performed by pattern matching between the image of the second shot region and an image of a third shot region among the plurality of shot regions to be inspected. The third shot region is adjacent to the second shot region on the side opposite to the first shot region. The image comparison unit 42 supplies a comparison result of the first comparison process and a comparison result of the second comparison process to the pattern specifying unit 43 and the pattern determination unit 45. Each of the comparison result of the first comparison process and the comparison result of the second comparison process has the number of points which are inconsistent in comparisons of the respective shot regions (that is, matching scores are lower than the score threshold) as information on the number of errors.

The pattern specifying unit 43 specifies a first actual pattern in the first shot region which is not consistent in the first comparison process but is consistent in the second comparison process. The pattern specifying unit 43 acquires the layout data 48e from the storage unit 48 and searches for the same design pattern as the design pattern corresponding to the first actual pattern in the layout data 48e. The pattern specifying unit 43 specifies a second actual pattern based on the search result. The second actual pattern is an actual pattern in the first shot region which corresponds to the same design pattern as a design pattern corresponding to the first actual pattern, and is consistent in the first comparison process and is consistent in the second comparison process. The pattern specifying unit 43 supplies information of the specified first actual pattern and information of the specified second actual pattern to the image extraction unit 44.

The image extraction unit 44 acquires an image of the first shot region from the storage unit 48. The image extraction unit 44 performs pattern matching of the first actual pattern on the image of the first shot region based on the information of the first actual pattern, and extracts a plurality of images of the first actual pattern from the image of the first shot region. The image extraction unit 44 performs pattern matching of the second actual pattern on the image of the first shot region based on the information of the second actual pattern, and extracts a plurality of images of the second actual pattern from the image of the first shot region. The image extraction unit 44 stores the extracted images of the first actual pattern and the extracted images of the second actual pattern as extraction image data 48c in the storage unit 48.

The pattern determination unit 45 acquires the extraction image data 48c from the storage unit 48. The pattern determination unit 45 determines each of the number of first actual patterns and the number of second actual patterns based on the extraction image data 48c. The pattern determination unit 45 extracts information on the number of errors from the comparison result of the first comparison process and the comparison result of the second comparison process. The pattern determination unit 45 determines which one of the first actual pattern and the second actual pattern is a correct pattern based on the number of first actual patterns, the number of second actual patterns, and the number of errors in the first comparison process and the second comparison process. The pattern determination unit 45 supplies a determination result to the reference image generation unit 46.

The reference image generation unit 46 replaces an image of one actual pattern of the first actual pattern and the second actual pattern in the first shot region with the image of the other actual pattern to generate a reference image of the first shot region. That is, when the second actual pattern is correct based on the determination result of the pattern determination unit 45, the reference image generation unit 46 replaces the image of the first actual pattern in the first shot region with the image of the second actual pattern to generate the reference image of the first shot region. When the first actual pattern is correct based on the determination result of the pattern determination unit 45, the controller 30 replaces the image of the second actual pattern in the first shot region with the image of the first actual pattern to generate the reference image of the first shot region. The reference image generation unit 46 stores the generated reference image as reference image data 48d in the storage unit 48.

The inspection unit 47 performs a defect inspection of the second shot region by comparing the reference image and the image of the second shot region. That is, the inspection unit 47 acquires the reference image data 48 and the image data of the second shot region included in the image data 48b of each shot region from the storage unit 48. The inspection unit 47 compares the reference image and the image of the second shot region by pattern matching based on the reference image data 48 and the image data of the second shot region, obtains a matching score indicating the degree of consistency, detects a point where the matching score is lower than the score threshold as a defective point, and obtains the detection result as illustrated in FIG. 4.

Figure 8:
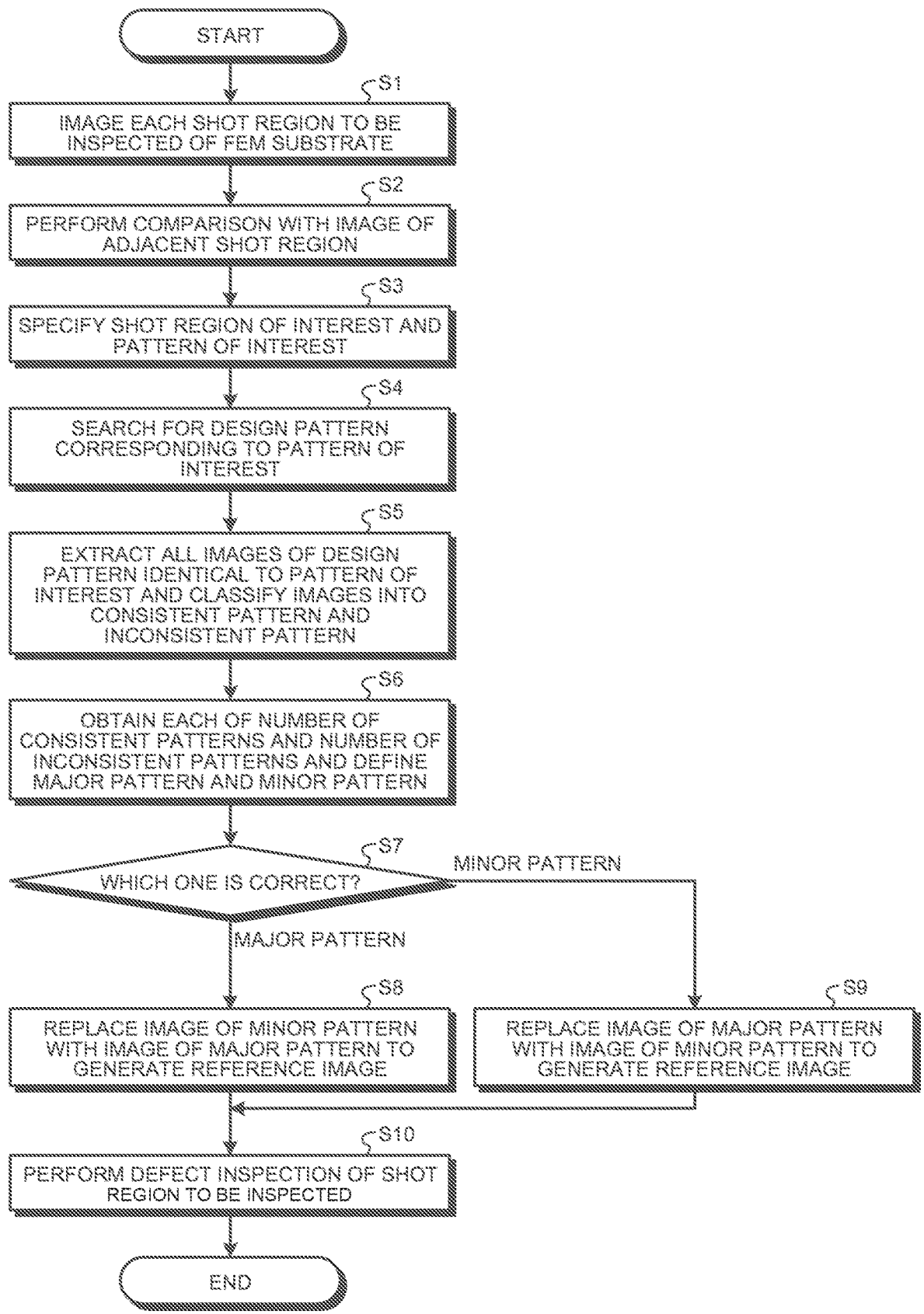
FIG. 8 is a flowchart illustrating an operation of the defect inspection apparatus according to the embodiment.

Next, an operation of the controller 30 will be described with reference to FIGS. 8 to 10B. FIG. 8 is a flowchart illustrating the operation of the controller 30. FIG. 9 is a view illustrating a process of comparing images of adjacent shot regions. FIGS. 10A and 10B are views illustrating information to determine a correct pattern.

When the defect inspection program 48a is activated, the controller 30 images each shot region of the FEM substrate 2 using the optical microscope 21 to obtain an image of each shot region (S1). The controller 30 compares an image of a shot region to be inspected with images of shot regions adjacent on both sides in the Y direction (or the X direction) while sequentially changing the shot region to be inspected (S2), specifies an adjacent shot region with one-side inconsistency as a shot region of interest based on such a comparison result, and specifies a pattern that is inconsistent at this time as a pattern of interest (S3).

For example, the controller 30 compares an image of a shot region to be inspected with an image of an adjacent shot region as illustrated in FIG. 9. FIG. 9 is a view illustrating a process of comparing an image of a shot region to be inspected with an image of an adjacent shot region.

When the shot region SH7 is a shot region to be inspected, no error occurs or the number of errors is equal to or smaller than the error threshold in a comparison result of a comparison process CP2 of comparing an image of the shot region SH7 and an image of the shot region SH6 adjacent on the −Y side. In a comparison result of a comparison process CP3 of comparing the image of the shot region SH7 and an image of the shot region SH8 adjacent on the +Y side, no error occurs or the number of errors is equal to or smaller than the error threshold.

When the shot region SH6 is a shot region to be inspected, errors occur and the number of errors exceeds the error threshold in a comparison result of a comparison process CP1 of comparing an image of the shot region SH6 and an image of the shot region SH5 adjacent on the −Y side. In the comparison result of the comparison process CP2 of comparing the image of the shot region SH6 and the image of the shot region SH7 adjacent on the +Y side, no error occurs or the number of errors is equal to or smaller than the error threshold.

As a result, it can be grasped that the shot region SH6 is a shot region which is inconsistent on one side and that a boundary between the shot region SH5 and the shot region SH6 is a boundary of a process window PW1. Then, the shot region SH5, which is a shot region adjacent to the boundary of the process window PW1 (an adjacent shot region with one-side inconsistency), is specified as the shot region of interest. In the shot region SH5, a point indicated by a hatched square in FIG. 9 is a point (first actual pattern) that is inconsistent in the comparison process CP1, and an error flag is attached thereto. Further, the number of errors in the shot region SH6 can be counted regarding the pattern of interest using the DBB function.

Returning to FIG. 8, the controller 30 searches for a design pattern corresponding to the pattern of interest in the layout data (S4). The controller 30 extracts all images having the same pattern as the design pattern of the pattern of interest from the shot region SH5 of interest based on such a search result (S5), and classifies all the extracted images of patterns into images of the first actual pattern (inconsistent pattern) and images of second actual pattern (consistent pattern).

For example, the first actual pattern indicated by a hatched square in FIG. 9 can specify a corresponding design pattern on the layout data using the DBB function. Pattern search is performed within the layout data for such a specified design pattern, and coordinates in the image of the shot region SH5 can be specified for all the searched patterns using the DBB function. It is possible to extract images of all the searched patterns from the image of the shot region SH5 using the specified coordinates. At this time, if no error flag is attached in the vicinity of an extracted image, the image of the pattern can be set as an image of the second actual pattern (consistent pattern). If the error flag is attached in the vicinity of the extracted image, the image of the pattern can be set as an image of the first actual pattern (inconsistent pattern). In FIG. 9, the image of the second actual pattern (consistent pattern) is indicated by a white square and the image of the first actual pattern (inconsistent pattern) is indicated by a hatched square.

Returning to FIG. 8, the controller 30 obtains each of the number of first actual patterns (inconsistent patterns) and the number of second actual patterns (consistent patterns) based on the classified results in S5. Further, the controller 30 obtains the total number of patterns from the sum of both the numbers. The controller 30 sets one the first actual pattern (inconsistent pattern) and the second actual pattern (consistent pattern) with the larger number as the major pattern and sets the other with the smaller number as the minor pattern (S6). Then, the controller 30 determines which one of the major pattern and the minor pattern is a correct pattern (S7).

For example, the controller 30 uses information illustrated in FIGS. 10A and 10B to determine which one of the major pattern and the minor pattern is the correct pattern. FIGS. 10A and 10B are views illustrating information to determine a correct pattern. The number of errors illustrated in FIGS. 10A and 10B may have a numerical value which is not highly accurate, but can be used to grasp a rough tendency.

In the case illustrated in FIG. 10A, the number of errors=100 is smaller than a half of the total number of patterns=1000 regarding the shot region SH6 to be inspected, and thus, it is possible to determine that the major pattern is the correct pattern and the minor pattern is an incorrect pattern.

In the case illustrated in FIG. 10B, the number of errors=600 is larger than the half of the total number of patterns=1000 regarding the shot region SH6 to be inspected, and thus, it is possible to determine that the minor pattern is the correct pattern and the major pattern is the incorrect pattern.

Returning to FIG. 8, when the major pattern is the correct pattern ("major pattern" in S7), the controller 30 replaces an image of the minor pattern with an image of the major pattern to generate a reference image (S8). If the minor pattern is the correct pattern ("minor pattern" in S7), the controller 30 replaces the image of the major pattern with the image of the minor pattern to generate a reference image (S9). The controller 30 compares the generated reference image with an image of a shot region to be inspected and performs a defect inspection of the shot region to be inspected (S10). As a result, the defect inspection result as illustrated in FIG. 4 is obtained.

As described above, in the present embodiment, one of the image of the pattern which is inconsistent on one side in the comparison of the image of the shot region to be inspected with both the sides and the image of the pattern which corresponds to the same design pattern and is consistent on both the sides is replaced with the other so as to create the reference image, and the defect inspection is performed using the reference image in the defect inspection apparatus 1. Thus, since the reference image can be optimized, the inspection accuracy in the defect inspection of the FEM substrate can be easily improved.

Figure 11:
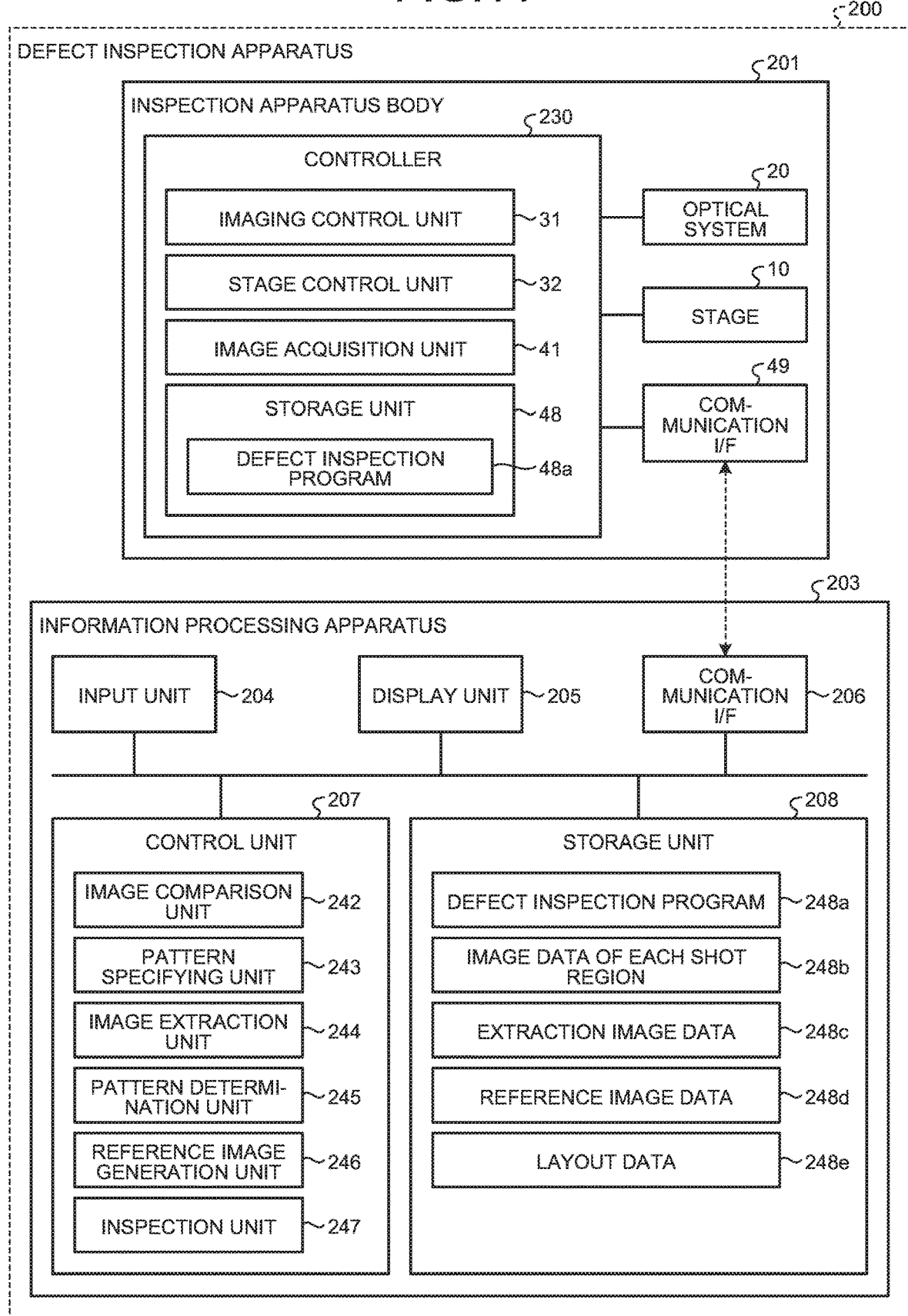
FIG. 11 is a diagram illustrating a configuration of a defect inspection apparatus according to a modification of the embodiment.

Incidentally, a defect inspection apparatus 200 is configured such that a defect inspection of an FEM substrate is performed in cooperation with a controller 230 and an information processing apparatus 203 connected to the controller 230 so as to be capable of communication as illustrated in FIG. 11. FIG. 11 is a diagram illustrating a configuration of a defect inspection apparatus according to a modification of the embodiment.

The defect inspection apparatus 200 includes an inspection apparatus body 201 and the information processing apparatus 203. The inspection apparatus body 201 includes a stage 10, an optical system 20, the controller 230, and a communication interface (communication I/F) 49. The controller 230 includes the imaging control unit 31, the stage control unit 32, the image acquisition unit 41, and the storage unit 48. The storage unit 48 stores the defect inspection program 48a.

The information processing apparatus 203 is, for example, a computer, and includes an input unit 204, a display unit 205, a communication interface (communication I/F) 206, a control unit 207, and a storage unit 208. The input unit 204 may include a keyboard, a mouse, a touch panel, or the like. The display unit 205 may include a display. The storage unit 208 is, for example, a memory, and stores a defect inspection program 248a and layout data 248e.

The communication I/F 49 and the communication I/F 206 are connected to be capable of communicating with each other via a wired communication line (for example, a network) or a wireless communication line (for example, a wireless LAN or the like). For example, the controller 230 and the control unit 207 can function as one controller by communicating with each other and sharing predetermined information.

The control unit 207 is, for example, a CPU, and includes an image comparison unit 242, a pattern specifying unit 243, an image extraction unit 244, a pattern determination unit 245, a reference image generation unit 246, and an inspection unit 247. Functions of the image comparison unit 242, the pattern specifying unit 243, the image extraction unit 244, the pattern determination unit 245, the reference image generation unit 246, and the inspection unit 247 are the same, respectively, as the functions of the image comparison unit 42, the pattern specifying unit 43, the image extraction unit 44, the pattern determination unit 45, the reference image generation unit 46, and the inspection unit 47 according to the embodiment.

Incidentally, each configuration of the image comparison unit 242, the pattern specifying unit 243, the image extraction unit 244, the pattern determination unit 245, the reference image generation unit 246, and the inspection unit 247 is a functional configuration of the control unit 207. These functional configurations may be mounted as hardware (for example, as a system on chip) in the control unit 207, or mounted as software (for example, as function modules which are developed in the storage unit 208 all at once or sequentially according to the progress of processing by the defect inspection program 248a) in the control unit 207. Alternatively, some of the elements may be mounted as hardware in the control unit 207, and the remaining elements may be mounted as software in the control unit 207.

The storage unit 208 may further store image data 248b, extraction image data 248c, reference image data 248d, and layout data 248e of each shot region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A defect inspection apparatus comprising:
a stage on which a substrate including a plurality of shot regions having common design information and mutually different lithography conditions is placed, the plurality of shot regions including a first shot region, a second shot region, and a third shot region; and
a controller circuit configured to (i) perform a first comparison process between an image of the first shot region and an image of the second shot region, the first shot region and the second shot region being adjacent to each other, (ii) perform a second comparison process between the image of the second shot region and an image of the third shot region, wherein the third shot region is adjacent to the second shot region on a side opposite to the first shot region, (iii) specify a first actual pattern which corresponds to a location in the first shot region, the second shot region, and the third shot region at which a mismatch is determined to occur in the first comparison process and at which a mismatch is not determined to occur in the second comparison process, (iv) specify a second actual pattern in the first shot region which corresponds to a design pattern identical to a design pattern corresponding to the first actual pattern, and which corresponds to a location in the first shot region, the second shot region, and the third shot region at which a mismatch is not determined to occur in the first comparison process, and at which a mismatch is not determined to occur in the second comparison process, (v) acquire an image of the first actual pattern in the first shot region and an image of the second actual pattern in the first shot region, (vi) either replace the image of the first actual pattern in the first shot region with the image of the second actual pattern in the first shot region so as to generate a reference image, or replace the image of the second actual pattern in the first shot region with the image of the first actual pattern in the first shot region so as to generate the reference image, and (vii) compare the reference image and the image of the second shot region so as to perform a defect inspection of the second shot region.

2. The defect inspection apparatus according to claim 1, wherein the controller circuit determines which of the first actual pattern and the second actual pattern is a correct pattern which does not generate an error, and either replaces the image the first actual pattern in the first shot region with the image of the second actual pattern in the first shot region, or replaces the image of the second actual pattern in the first shot region with the image of the second actual pattern in the first shot region, based on a result of the determination so as to generate the reference image.

3. The defect inspection apparatus according to claim 2, wherein when the second actual pattern is the correct pattern, the controller circuit replaces the image of the first actual pattern in the first shot region with the image of the second actual pattern so as to generate the reference image.

4. The defect inspection apparatus according to claim 2, wherein when the first actual pattern is the correct pattern, the controller circuit replaces the image of the second actual pattern in the first shot region with the image of the first actual pattern so as to generate the reference image.

5. The defect inspection apparatus according to claim 2, wherein the controller circuit determines which of the first actual pattern and the second actual pattern is the correct pattern based on a number of first actual patterns, a number of second actual patterns, and a number of errors in the first comparison process and the second comparison process.

6. The defect inspection apparatus according to claim 5, wherein the controller circuit determines that the second actual pattern is the correct pattern when the number of the first actual patterns is greater than the number of the second actual patterns and the number of errors in the first comparison process and the second comparison process is greater than a half of a number of patterns.

7. The defect inspection apparatus according to claim 5, wherein the controller circuit determines that the second actual pattern is the correct pattern when the number of the first actual patterns is fewer than the number of the second actual patterns and the number of errors in the first comparison process and the second comparison process is fewer than a half of a number of patterns.

8. The defect inspection apparatus according to claim 5, wherein the controller circuit determines that the first actual pattern is the correct pattern when the number of the first actual patterns is fewer than the number of the second actual patterns and the number of errors in the first comparison process and the second comparison process is greater than a half of a number of patterns.

9. The defect inspection apparatus according to claim 5, wherein the controller circuit determines that the first actual pattern is the correct pattern when the number of the first actual patterns is greater than the number of the second actual patterns and the number of errors in the first comparison process and the second comparison process is fewer than a half of a number of patterns.

10. The defect inspection apparatus according to claim 1, wherein in the substrate, shot regions among the plurality of shot regions having different exposure dose amounts are arrayed side by side in a first direction, and shot regions among the plurality of shot regions having different focus values are arrayed side by side in a second direction, with a predetermined shot region among the plurality of shot regions as a center.

11. A defect inspection method comprising:
performing, by a controller circuit, for a first substrate including a plurality of shot regions having common design information and mutually different lithography conditions, the plurality of shot regions including a first shot region, a second shot region and a third shot region, a first comparison process between an image of the first shot region and an image of the second shot region, the first shot region and the second shot region being adjacent to each other;
performing, by the controller circuit, a second comparison process between the image of the second shot region and an image of the third shot region, wherein the third shot region is adjacent to the second shot region on a side opposite to the first shot region;
specifying, by the controller circuit, a first actual pattern which corresponds to a location in the first shot region, the second shot region, and the third shot region at which a mismatch is determined to occur in the first comparison process and at which a mismatch is not determined to occur in the second comparison process;
specifying, by the controller circuit, a second actual pattern which corresponds to a design pattern identical to a design pattern corresponding to the first actual pattern, and which corresponds to a location in the first shot region, the second shot region, and the third shot region at which a mismatch is not determined to occur in the first comparison process, and at which a mismatch is not determined to occur in the second comparison process;
acquiring, by the controller circuit, an image of the first actual pattern in the first shot region and an image of the second actual pattern in the first shot region;
generating, by the controller circuit, a reference image by either (i) replacing the image of the first actual pattern in the first shot region with the image of the second actual pattern in the first shot region, or (ii) replacing the image of the second actual pattern in the first shot region with the image of the first actual pattern in the first shot region; and
comparing, by the controller circuit, the reference image and the image of the second shot region so as to perform a defect inspection of the second shot region.

12. The defect inspection method according to claim 11, further comprising:
correcting, by the controller circuit, mask data corresponding to one of the first actual pattern and the second actual pattern whose image is replaced in the first shot region to generate the reference image, based on a result of the defect inspection of the second shot region;
manufacturing a second substrate including a plurality of shot regions having common design information and mutually different lithography conditions using the corrected mask data, the plurality of shot regions included in the second substrate including a fourth shot region, a fifth shot region, and a sixth shot region;
performing, by the controller circuit, a third comparison between an image of the fourth shot region and an image of the fifth shot region, the fourth shot region and the fifth shot region being adjacent to each other in the second substrate;
performing, by the controller circuit, a fourth comparison between the image of the fifth shot region and an image of the sixth shot region, wherein the sixth shot region is adjacent to the fifth shot region on a side opposite to the fourth shot region;
specifying, by the controller circuit, a third actual pattern which corresponds to a location in the fourth shot region, the fifth shot region, and the sixth shot region at which a mismatch is determined to occur in the third comparison and at which a mismatch is not determined to occur in the fourth comparison;
specifying, by the controller circuit, a fourth actual pattern which corresponds to a design pattern identical to a design pattern corresponding to the third actual pattern, and which corresponds to a location in the fourth shot region, the fifth shot region, and the sixth shot region at which a mismatch is not determined to occur in the third comparison and at which a mismatch is not determined to occur in the fourth comparison;
generating, by the controller circuit, a second reference image by either (i) replacing the image of the third actual pattern in the fourth shot region with the image of the fourth actual pattern in the fourth shot region or (ii) replacing the image of the fourth actual pattern in the fourth shot region with the image of the third actual pattern in the fourth shot region; and
comparing, by the controller circuit, the second reference image and the image of the fifth shot region so as to perform a defect inspection of the fifth shot region.

13. The defect inspection method according to claim 11, wherein the generating the reference image of the first shot region includes:
determining, by the controller circuit, which of the first actual pattern and the second actual pattern is a correct pattern which does not generate an error;
replacing, by the controller circuit, the image of the first actual pattern in the first shot region with the image of the second actual pattern when the second actual pattern is the correct pattern; and
replacing, by the controller circuit, the image of the second actual pattern in the first shot region with the image of the first actual pattern when the first actual pattern is the correct pattern.

14. The defect inspection method according to claim 13, wherein the determining is based on a number of the first actual patterns, a number of the second actual patterns, and a number of errors in the first comparison process and the second comparison process.

15. The defect inspection method according to claim 14, wherein the determining includes determining, by the controller circuit, that the second actual pattern is the correct pattern when the number of the first actual patterns is greater than the number of the second actual patterns and the number of errors in the first comparison process and the second comparison process is greater than a half of a number of patterns.

16. The defect inspection method according to claim 14, wherein the determining includes determining, by the controller circuit, that the second actual pattern is the correct pattern when the number of the first actual patterns is fewer than the number of the second actual patterns and the number of errors in the first comparison process and the second comparison process is fewer than a half of a number of patterns.

17. The defect inspection method according to claim 14, wherein the determining includes determining, by the controller circuit, that the first actual pattern is the correct pattern when the number of the first actual patterns is fewer than the number of the second actual patterns and the number of errors in the first comparison process and the second comparison process is greater than a half of a number of patterns.

18. The defect inspection method according to claim 14, wherein the determining includes determining, by the controller circuit, that the first actual pattern is the correct pattern when the number of the first actual patterns is greater than the number of the second actual patterns and the number of errors in the first comparison process and the second comparison process is fewer than a half of a number of patterns.

19. A nontransitory computer readable recording medium in which a defect inspection program is recorded, the program being executable by a controller circuit of a defect inspection apparatus to control the controller circuit to execute functions comprising:

performing, in a first substrate including a plurality of shot regions having common design information and mutually different lithography conditions, the plurality of shot regions including a first shot region, a second shot region and a third shot region, a first comparison process between an image of the first shot region and an image of the second shot region, the first shot region and the second shot region being adjacent to each other;

performing a second comparison process between the image of the second shot region and an image of the third shot region, wherein the third shot region is adjacent to the second shot region on a side opposite to the first shot region;

specifying a first actual pattern which corresponds to a location in the first shot region, the second shot region, and the third shot region at which a mismatch is determined to occur in the first comparison process and at which a mismatch is not determined to occur in the second comparison process;

specifying a second actual pattern which corresponds to a design pattern identical to a design pattern corresponding to the first actual pattern, and which corresponds to a location in the first shot region, the second shot region, and the third shot region at which a mismatch is not determined to occur in the first comparison process, and at which a mismatch is not determined to occur in the second comparison process;

acquiring an image of the first actual pattern in the first shot region and an image of the second actual pattern in the first shot region;

generating a reference image by either (i) replacing the image of one of the first actual pattern in the first shot region with the image of the second actual pattern in the first shot region, or (ii) replacing the image of the second actual pattern in the first shot region with the image of the first actual pattern in the first shot region; and comparing the reference image and the image of the second shot region so as to perform a defect inspection of the second shot region.

20. The recording medium according to claim 19, wherein the generating the reference image includes:

determining which of the first actual pattern and the second actual pattern is a correct pattern which does not generate an error;

replacing the image of the first actual pattern in the first shot region with the image of the second actual pattern when the second actual pattern is the correct pattern; and replacing the image of the second actual pattern in the first shot region with the image of the first actual pattern when the first actual pattern is the correct pattern.

\* \* \* \* \*